(12) United States Patent
Oh et al.

(10) Patent No.: US 7,474,061 B2
(45) Date of Patent: Jan. 6, 2009

(54) ORGANIC ELECTROLUMINESCENT DISPLAY

(75) Inventors: Tae-Sik Oh, Suwon-si (KR); Ho-nyeon Lee, Seongnam-si (KR); Sung-Kee Kang, Seongnam-si (KR); Ick-hwan Ko, Seoul (KR); Young-gu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/565,200

(22) Filed: Nov. 30, 2006

(65) Prior Publication Data
US 2007/0176863 A1    Aug. 2, 2007

(30) Foreign Application Priority Data
Feb. 2, 2006    (KR) .................. 10-2006-0010181

(51) Int. Cl.
G09G 3/10    (2006.01)
G09G 3/30    (2006.01)
H01L 29/40    (2006.01)
(52) U.S. Cl. ................. 315/169.3; 257/777; 345/80
(58) Field of Classification Search ............. 315/169.1, 315/169.3, 169.4; 345/204, 206, 36, 46, 345/51, 76–78, 84, 92; 257/40, 777; 313/504–505, 313/609
See application file for complete search history.

(56) References Cited
U.S. PATENT DOCUMENTS

| | | | |
|---|---|---|---|
| 6,693,383 B2 * | 2/2004 | Bae et al. ................. | 315/169.1 |
| 6,753,654 B2 * | 6/2004 | Koyama ................... | 315/169.1 |
| 6,768,207 B2 * | 7/2004 | Tao et al. .................... | 257/777 |
| 6,861,710 B2 * | 3/2005 | Murakami et al. .......... | 257/359 |
| 6,989,571 B2 * | 1/2006 | Park et al. ................... | 257/350 |
| 7,132,801 B2 * | 11/2006 | Park et al. ................ | 315/169.3 |
| 7,151,274 B2 * | 12/2006 | Park ........................... | 257/40 |
| 7,211,944 B2 * | 5/2007 | Bae et al. .................... | 313/503 |
| 7,247,878 B2 * | 7/2007 | Park et al. ..................... | 257/40 |
| 2005/0140303 A1 * | 6/2005 | Lee et al. ................. | 315/169.3 |

FOREIGN PATENT DOCUMENTS

| | | |
|---|---|---|
| KR | 1020040007823 | 1/2004 |
| KR | 1020040059701 | 7/2004 |

* cited by examiner

*Primary Examiner*—Douglas W. Owens
*Assistant Examiner*—Minh Dieu A
(74) *Attorney, Agent, or Firm*—Cantor Colburn LLP

(57) ABSTRACT

An organic electroluminescent display ("OELD") includes an organic light-emitting diode ("OLED") panel and a driving panel. The OLED panel includes an image display portion which displays an image using an OLED, and the driving panel includes a driving circuit portion which controls the image display portion. The OLED panel and the driving panel are combined into one body to complete the OELD. The image display portion and the driving circuit portion are electrically connected through pads disposed between the OLED panel and the driving panel, and the OLED panel and the driving panel are fabricated using separate processes, thus preventing the driving panel from being damaged by heat generated in the fabrication process of the OLED panel.

26 Claims, 4 Drawing Sheets

ORGANIC ELECTROLUMINESCENT DISPLAY

This application claims priority to Korean Patent Application No. 10-2006-0010181, filed on Feb. 2, 2006, and all the benefits accruing therefrom under 35 U.S.C. § 119, the contents of which in its entirety are herein incorporated by reference.

BACKGROUND OF THE INVENTION

1. Field of the Invention

The present invention relates to an organic electroluminescent display ("OELD"), and more particularly, to an OELD using two panels.

2. Description of the Related Art

Organic electroluminescent displays ("OELDs") are self-luminescent displays which use an organic compound as a luminescent material. When compared to non-luminescent thin film transistor ("TFT") liquid crystal displays ("LCDs"), OELDs are simple and inexpensive to fabricate and have low power consumption, small thickness, and high response speed.

Active matrix OELDs include a plurality of organic light-emitting diodes ("OLEDs") arranged in an X-Y matrix configuration and a semiconductor circuit driving the OLEDs. A conventional stack type OELD is generally a top emission type OELD. Top emission type OELDs radiate light to an outside in a direction opposite to the substrate on which the OLED is placed. In a top emission type OELD, an OLED array is disposed on a driving circuit including a plurality of transistors such that the OLED array overlaps the driving circuit. A planarization layer is formed between the OLED array and the driving circuit, and through holes are formed in the planarization layer to electrically connect the driving circuit and the OLED array.

In such a conventional stack type OELD, when an organic thin film transistor ("OTFT") of a driving circuit is formed out of an organic semiconductor material, it may be damaged by the plasma which is used to form an OLED array on the driving circuit. While the OTFT can be formed using a low-temperature process, the OLED array is fabricated at high temperatures of 150° C. or more. When the OTFT is exposed to high-temperatures in the high-temperature OLED array fabrication process, its operating characteristics may be degraded due to damage caused by the high-temperatures.

Moreover, the driving circuit includes a switching transistor, a driving transistor, and a storage capacitor, and thus has an uneven surface. Therefore, before formation of the OLED array on the driving circuit, a planarization layer must be formed on the driving circuit in order to planarize the uneven surface of the driving circuit. Otherwise the OLED would be laid down unevenly and its electrical and light-emitting characteristics would be degraded. Also, it is necessary to form a through hole in the planarization layer in order to electrically connect the driving circuit and the OLED array.

BRIEF SUMMARY OF THE INVENTION

An aspect of the present invention provides an electroluminescent display ("OELD") without the need of a planarization layer for a driving circuit.

Another aspect of the present invention provides an OELD whose organic light-emitting diode ("OLED") array and driving circuit may be separately fabricated, thereby making it possible to protect the driving circuit from the heat associated with a high-temperature fabrication process for the OLED array.

According to an exemplary embodiment of the present invention, there is provided an OELD including: a plurality of OLEDs, a driving circuit driving the OLEDs, an organic light-emitting diode panel having a first substrate on which the OLEDs are arranged, a driving panel having a second substrate on which the driving circuit is formed, and electrical connection units disposed corresponding to each other between the first and second substrates, to electrically connect the OLED to the driving circuit, wherein the organic light-emitting diode panel and the driving panel are combined.

The electrical connection units may include first and second conductive pads disposed opposite one another on the organic light-emitting diode panel and the driving panel, respectively.

The OELD may further include first dam-type banks formed on the first substrate to define a region in which the OLED is formed, and the first conductive pad may be formed on the top surface of the first dam-type bank.

The OELD may further include second dam-type banks formed on the second substrate corresponding in location to the first dam-type banks, and the second conductive pad may be formed on the top surface of the second dam-type bank.

According to another exemplary embodiment of the present invention, there is provided a method of manufacturing an OELD, the method including; forming a plurality of OLEDs, forming a driving circuit driving the OLEDs, forming an OLED panel having a first substrate on which the OLEDs are arranged, forming a driving panel having a second substrate on which the driving circuit is formed, forming electrical connection units disposed corresponding to each other between the first and second substrates, to electrically connect the OLEDs to the driving circuit, and combining the OLED panel and the driving panel.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

Figure 1:
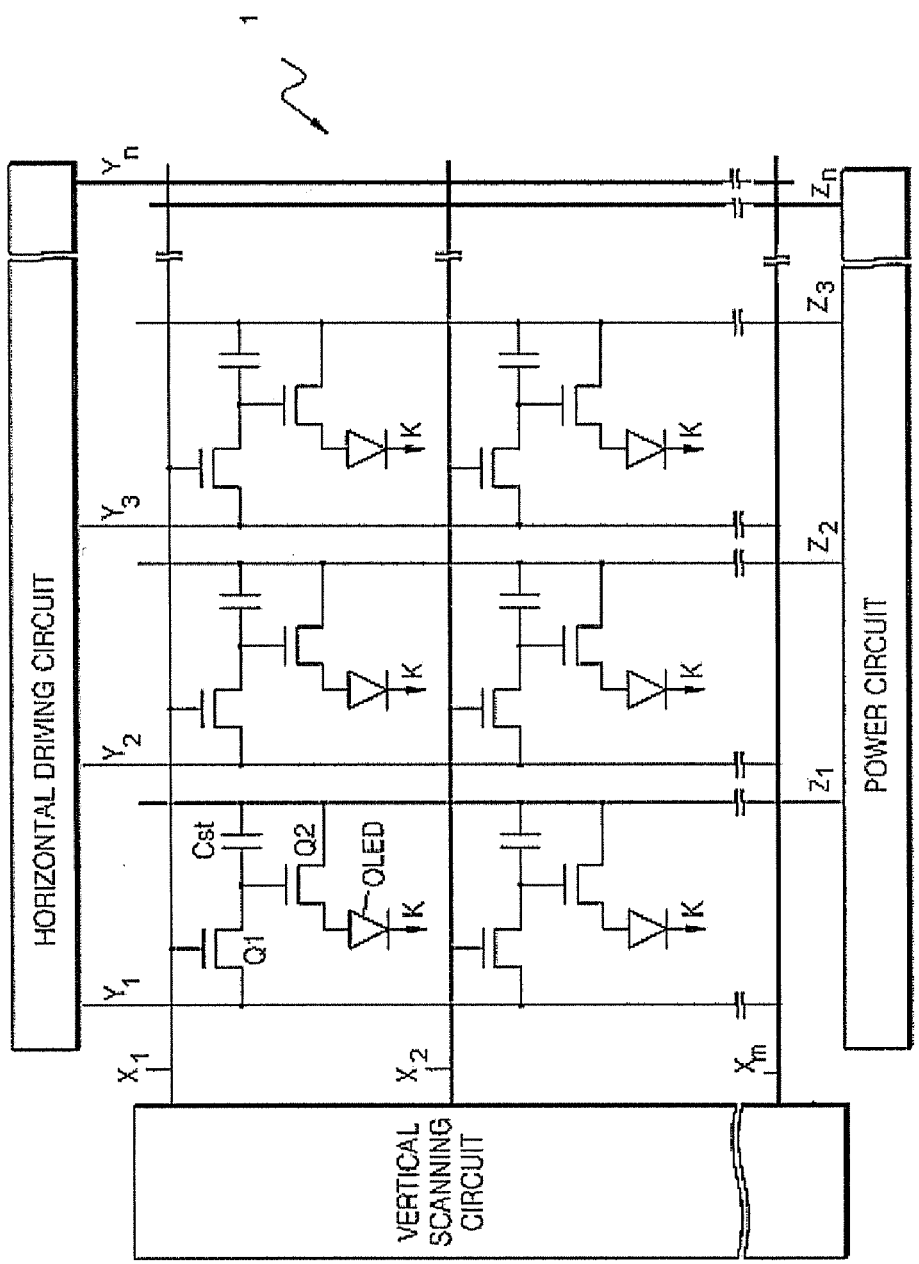
FIG. 1 is an equivalent circuit schematic diagram of an exemplary embodiment of an electroluminescent display ("OELD") according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
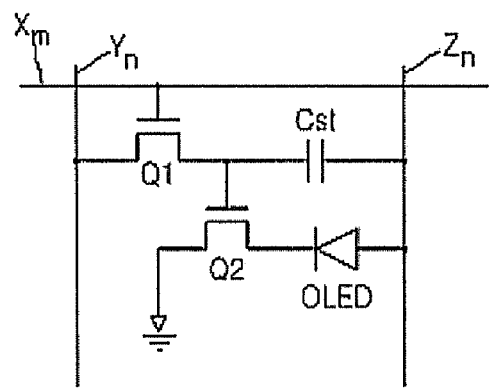
FIG. 2 is an equivalent circuit schematic diagram of an exemplary embodiment of a unit-pixel of an OELD according to the present invention.

FIG. 1 is an equivalent circuit diagram of an exemplary embodiment of a two-transistor-one-capacitor ("2T-1C") organic electroluminescent display ("OELD") 1 according to the present invention. FIG. 2 is an equivalent circuit diagram of an exemplary embodiment of a unit-pixel of an OELD according to the present invention.

Referring to FIG. 1, the OELD 1 according to an embodiment of the present invention includes a plurality of parallel lines X1-Xm, a plurality of parallel lines Y1-Yn perpendicular to the lines X1-Xm, and a plurality of parallel lines Z1-Zn spaced apart from the lines Y1-Yn by a predetermined distance. The X lines and the Y lines form a matrix configuration. Unit-pixels are disposed in regions which are defined by the X lines, the Y lines, and the Z lines.

The X lines X1-Xm are scanning lines to which a vertical scanning signal is applied, and the Y lines Y1-Yn are data lines to which a horizontal driving signal (e.g., an image signal) is applied. The X lines X1-Xm are connected to a vertical driving circuit, and the Y lines Y1-Yn are connected to a horizontal driving circuit. The Z lines Z1-Zn are connected to a power circuit for driving an organic light-emitting diode ("OLED").

Each of the unit-pixels includes a switching transistor Q1, a driving transistor Q2, and a storage capacitor Cst. In each unit-pixel, the gate, source and drain of the switching transistor Q1 are connected to one of the X lines X1-Xm, one of the Y lines Y1-Yn, and the gate of the driving transistor Q2, respectively. The switching transistor Q1 operates to apply an electric charge to the storage capacitor Cst, and the storage capacitor Cst accumulates the applied electric charge to store data for each unit-pixel. The storage capacitor Cst is connected in parallel to the gate and source of the driving transistor Q2. The drain of the driving transistor Q2 is connected to the anode of the OLED. The cathode K of the OLED corresponds to a common electrode shared by all of the unit-pixels.

The unit-pixels of the exemplary embodiment of an OELD of FIG. 1 use p-channel TFTs. Alternative exemplary embodiments include configurations where the unit-pixel of the OELD uses n-channel TFTs, as shown in FIG. 2.

Referring to FIG. 2, a switching transistor Q1 and a driving transistor Q2 are n-channel TFTs. Accordingly, an OLED is connected between a Z line Z1-Zn and the source of the driving transistor Q2, and the drain of the driving transistor Q2 is grounded.

Figure 3:
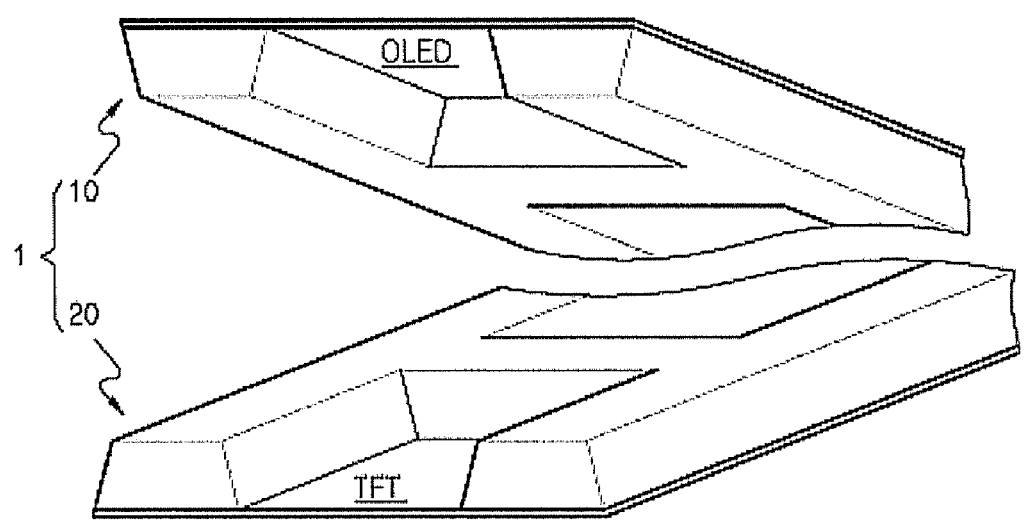
FIG. 3 is an exploded perspective view of an exemplary embodiment of an OELD according to the present invention.

FIG. 3 is an exploded perspective view of an exemplary embodiment of an OELD 1 according to the present invention which illustrates a technical concept of the present invention. Referring to FIG. 3, the OELD 1 according to the current embodiment of the present invention is divided into an OLED panel 10 and a driving panel 20 which are formed on separate substrates. The detailed structure of the exemplary embodiment of an OELD 1 according to the present invention will now be described with reference to FIGS. 4 through 7.

Figure 4:
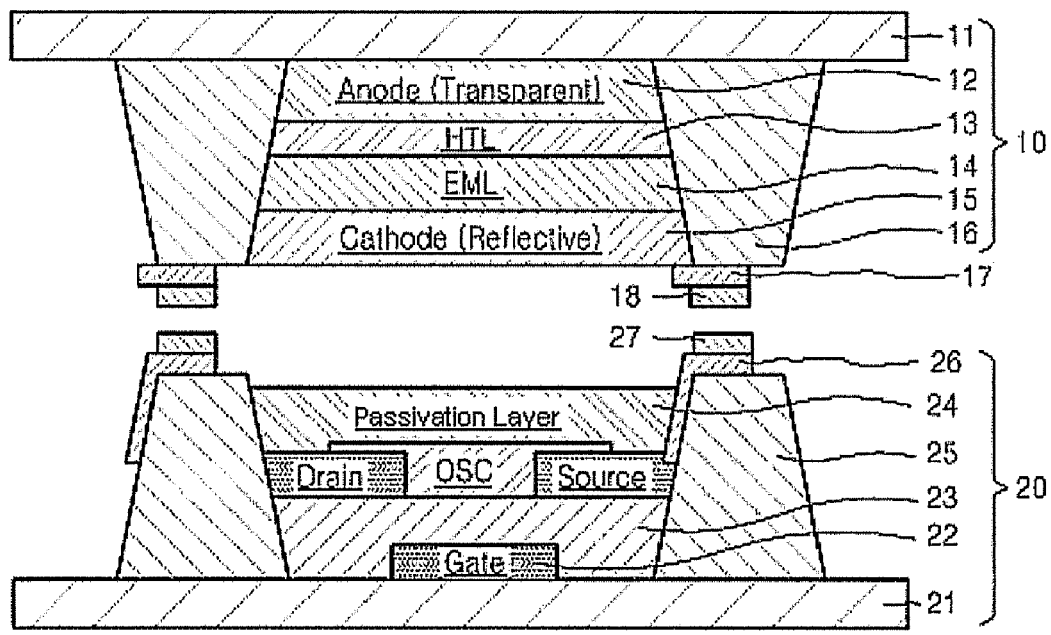
FIGS. 4 through 7 are cross-sectional views of exemplary embodiments of OELDs according to the present invention.
Figure 5:
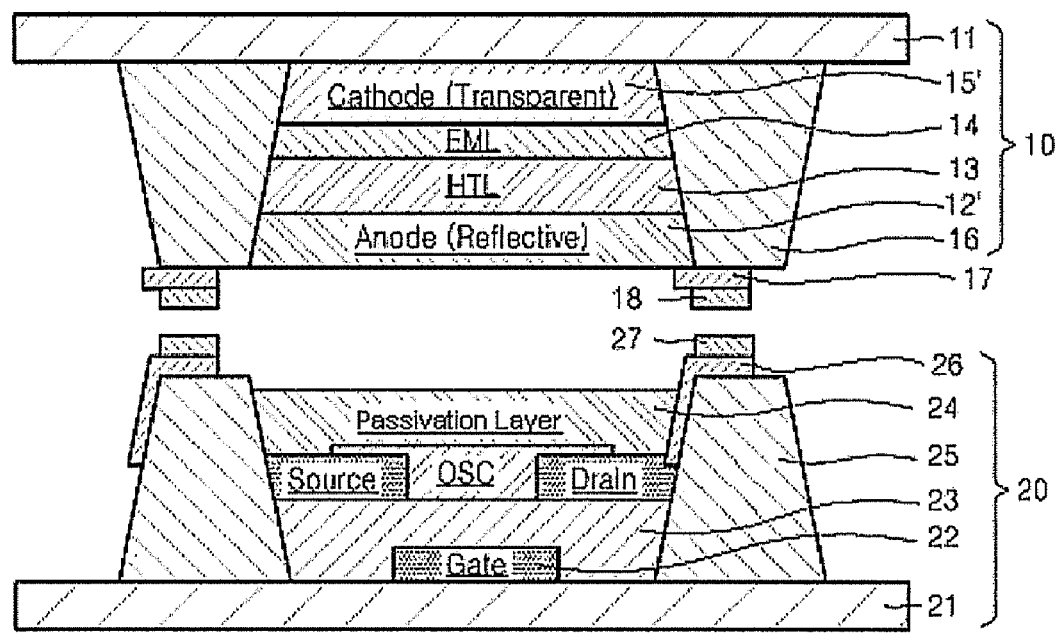
Figure 6:
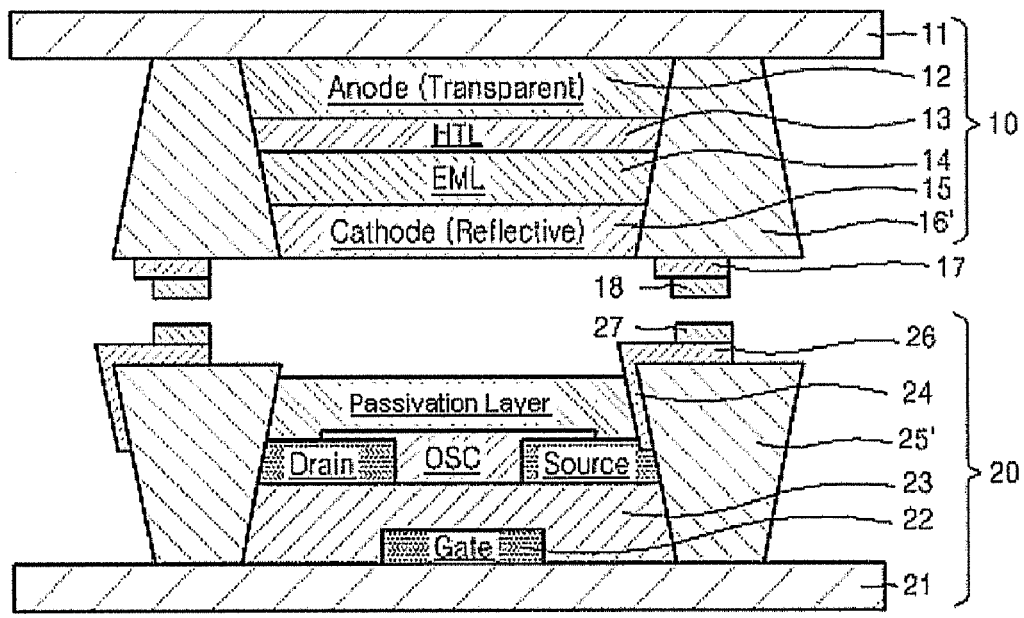
Figure 7:
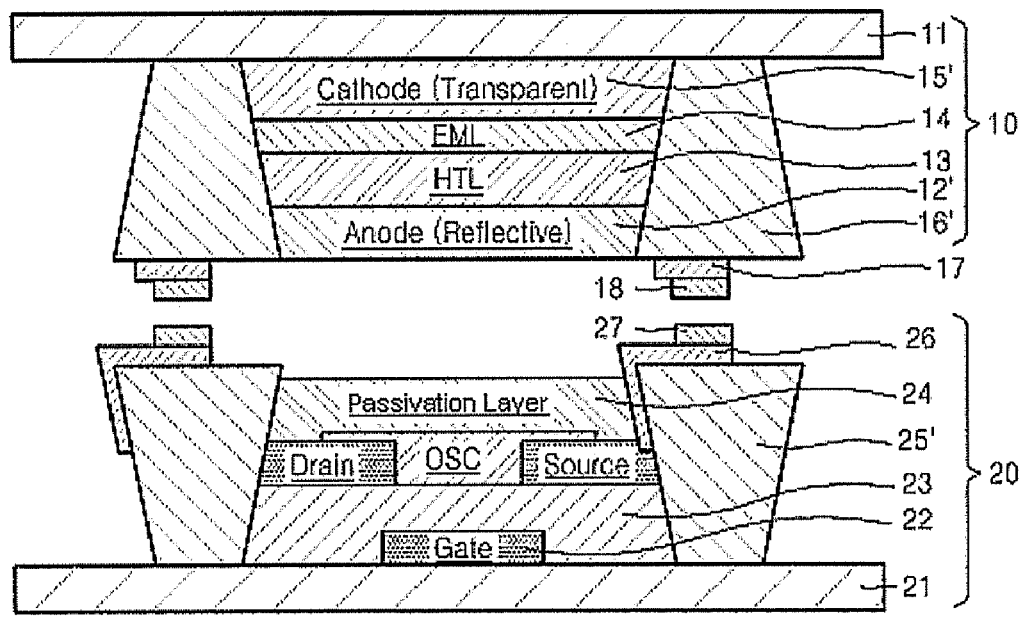

FIGS. 4 and 5 are cross-sectional views illustrating the structures of exemplary embodiments of the top emission type OELDs according to the present invention. FIGS. 6 and 7 are cross-sectional views illustrating the structures of alternative exemplary embodiments of top emission type OELDs according to the present invention.

FIG. 4 is a cross-sectional view of an exemplary embodiment of a unit-pixel of a top emission type OELD using an n-channel TFT according to the present invention. Although the unit-pixel includes a switching transistor, an OLED, and a driving transistor driving the OLED, the switching transistor is omitted from FIG. 4 for clarity. FIG. 4 illustrates only a stacked structure of the driving transistor and the OLED.

Referring to FIG. 4, an OLED display panel includes an OLED panel 10 and a driving panel 20. The OLED panel 10 includes a first substrate 11, exemplary embodiments of which are formed of a transparent material such as glass or plastic, and an OLED formed on the first substrate 11. The driving panel 20 includes a second substrate 21, which may serve as a base plate of the OLED display panel, and a driving circuit formed on the second substrate 21.

In the OLED panel 10, first dam-type banks 16 having a predetermined height, and which are spaced apart from each other by a predetermined distance, are formed on the first substrate 11 to define a unit-pixel region. A stack of layers for the OLED are formed in the unit-pixel region. The OLED includes a transparent anode 12, a hole transporting layer ("HTL") 13, an emission material layer ("EML") 14, and a reflective cathode 15. A first pad 17 is formed on a bottom surface of each of the first dam-type banks 16 such that it is electrically connected to the reflective cathode 15. Exemplary embodiments of the first pad 17 are formed of titanium. A conductive adhesive layer 18 is formed on the first pads 17. Exemplary embodiments of the conductive adhesive layer 18 are formed of indium. Although not shown in FIG. 4, the transparent anode 12 is connected to a Z line Z1-Zn (as shown in FIG. 1) to which an OLED driving voltage is applied.

In the driving panel 20, second dam-type banks 25 having a predetermined height, which correspond in location to the first dam-type banks 16 of the OLED panel 10, are formed on the second substrate 21 to define a driving circuit region. The driving circuit is formed in the driving circuit region between the second dam-type banks 25. The driving circuit includes a switching transistor, a driving transistor, and a storage capacitor, as illustrated in FIG. 1. Only a driving transistor TFT driving the OLED is illustrated in FIG. 4, for conciseness. Referring to FIG. 4, a TFT serving as the driving transistor is formed between the second dam-type banks 25 on the second substrate 21. The TFT may be formed using any of several well-known organic or inorganic semiconductor materials. A gate 22 of the TFT is formed on the second substrate 21, and a gate insulating layer 23 is formed on the resulting structure including the gate 22. An organic semiconductor layer OSC is formed on the gate insulating layer 23, and the drain and the source of the TFT are formed such that they are connected respectively to both sides of the organic semiconductor layer OSC. A passivation layer 24 is formed on the resulting structure to protect the organic semiconductor layer OSC, the drain, and the source.

A second pad 26, which corresponds in location to the first pad 17 of the first dam-type bank 16, is formed on a top surface of each of the second dam-type banks 25, and a conductive adhesive layer 27 is formed on the second pads 26. The second pad 26 is connected to the source of the driving TFT, and the drain is grounded (not shown). Exemplary embodiments of the second pad 26 are formed of titanium. Exemplary embodiments of the conductive adhesive layer 27 are formed of indium.

The conductive adhesive layers 18 and 27 are used to attach the first dam-type banks 16 to the corresponding second dam-type banks 25 such that the OLED panel 10 and the driving panel 20 are combined into one body. Thereafter, the outermost edges of the combined structure are sealed with a sealing member (not illustrated).

FIG. 5 is a cross-sectional view of an exemplary embodiment of a unit-pixel of a top emission type OELD using a p-channel TFT, according to the present invention. Unlike the top emission type OELD of FIG. 4, the top emission type OELD of FIG. 5 uses a p-type semiconductor material. In the top emission type OELD of FIG. 5, an anode of an OLED of an OLED panel 10 is connected to a drain of a TFT serving as a driving transistor, and a cathode of the OLED is grounded (the grounding connection is not shown).

Referring to FIG. 5, an OLED display panel includes an OLED panel 10 and a driving panel 20. The OLED panel 10 includes a first substrate 11, exemplary embodiments of which are formed of a transparent material such as glass or plastic, and an OLED formed on the first substrate 11. The driving panel 20 includes a second substrate 21, which may serve as a base plate of the OLED display panel, and a driving circuit formed on the second substrate 21.

In the OLED panel 10, first dam-type banks 16 having a predetermined height, and which are spaced apart from each other by a predetermined distance, are formed on the first substrate 11 to define a unit-pixel region. A stack of layers for the OLED are formed in the unit-pixel region. The OLED includes a transparent cathode 15', an emission material layer ("EML") 14, a hole transparent layer ("HTL") 13, and a reflective anode 12'. A first pad 17 is formed on a bottom surface of each of the first dam-type banks 16 such that it is electrically connected to the reflective anode 12'. Exemplary embodiments of the first pad 17 are formed of titanium. A conductive adhesive layer 18 is formed on the first pads 17. Exemplary embodiments of the conductive adhesive layer 18 are formed of indium.

In the driving panel 20, second dam-type banks 25 having a predetermined height, and which correspond in location to the first dam-type banks 16 of the OLED panel 10, are formed on the second substrate 21 to define a driving circuit region. The driving circuit is formed in the driving circuit region between the second dam-type banks 16. A TFT serving as a driving transistor is formed between the dam-type second banks 25 on the second substrate 21. Exemplary embodiments of the TFT are formed of a well-known organic or inorganic semiconductor material. A gate 22 of the TFT is formed on the second substrate 21, and a gate insulating layer 23 is formed on the resulting structure including the gate 22. An organic semiconductor layer OSC is formed on the gate insulating layer 23, and the drain and the source of the TFT are formed such that they are connected respectively to both sides of the organic semiconductor layer OSC. A passivation layer 24 is formed on the resulting structure to protect the organic semiconductor layer OSC, the drain, and the source.

A second pad 26, which corresponds in location to the first pad 17 of the first dam-type bank 16, is formed on a top surface of each of the second dam-type banks 25 such that it is electrically connected to the drain of the TFT. A conductive adhesive layer 27 is formed on the second pads 26.

The conductive adhesive layers 18 and 27 are used to attach the first dam-type banks 16 to the corresponding second dam-type banks 25 such that the OLED panel 10 and the driving panel 20 are combined into one body. Thereafter, the outermost edges of the combined structure are sealed with a sealing member (not illustrated).

In both the exemplary embodiments shown in FIGS. 4 and 5, an OLED portion for displaying an image and a driving circuit portion for driving the OLED portion are formed using separate processes on the first and second substrates 11 and 21, and then the OLED portion and the driving circuit portion are combined into one body.

In the exemplary embodiments of FIGS. 4 and 5, the first and second dam-type banks 16 and 25 are trapezoidally shaped banks whose width decreases with distance away from the first and second substrates 11 and 21. However, alternative exemplary embodiments of the present invention include configurations where the banks have different shapes. One alternative configuration of the banks is discussed below with reference to FIGS. 6 and 7.

FIGS. 6 and 7 are cross-sectional views illustrating the structures of exemplary embodiments of top emission type OELDs according to the present invention, and are variations of the exemplary embodiments of FIGS. 4 and 5, respectively.

Referring to FIGS. 6 and 7, first and second banks 16' and 25' are formed in inverted trapezoidal shapes whose width increases away from first and second substrates 11 and 21, respectively. When compared to trapezoidal banks, inverted trapezoidal banks can increase an aspect ratio of an OLED.

In the previous exemplary embodiments of the present invention, the driving circuit is formed using an organic semiconductor material. However, the present invention is not limited thereto. In other exemplary embodiments of the present invention, the driving circuit may be formed using an inorganic semiconductor material, exemplary embodiments of which include silicon and ZnO. In such an exemplary embodiment the materials for the switching circuit and the OLED are selected accordingly. This material selection can be readily made according to this well-known technology.

Exemplary embodiments of the organic semiconductor material may be a p-type semiconductor material such as pentacene. Exemplary embodiments of the source and the drain may be formed of Au or Cr/Au. Exemplary embodiments of an n-type organic semiconductor material may be copper hexadecafluorophthalocyanine ("F16CuPc"), naphthalene-tetracaboxylic-dianhydride ("NTCDA"), or fluorohexylsexithiophene ("DHF-6T"). The gate insulating layer 22 may be formed of a well-known organic or inorganic insulating material. Exemplary embodiments of the organic insulating material include polyvinylpyrrolidone ("PVP") and polyvinylacetate ("PVA"). Exemplary embodiments of the inorganic insulating material include $SiO_2$, $Si_2N_3$, $Al_2O_3$, and $SiRiO_3$. Exemplary embodiments of the first and second dam-type banks 16, 16', 25 and 25' may be formed of a carbon-based organic material such as black photoresist, polyvinyl alcohol ("PVA"), photo acryl ("PA"), and polyimide ("PI"). Exemplary embodiments of the first and second substrates 11 and 21 may be formed of glass or plastic such as polyethersulfon ("PES"), polyethylene terephthalate ("PET"), or propylene carbonate ("PC").

The present invention can be applied to an OELD which uses a plastic substrate. In particular, the present invention can be conveniently applied to a top emission type OELD which uses an OTFT.

The present invention has the following advantages.

Unlike the prior art, the present invention makes it possible to omit a process of forming a planarization layer, which needed to be performed before formation of an OLED in a semiconductor circuit serving as a driving circuit. In particular, the present invention makes it possible to omit a difficult process of forming a through hole in the planarization layer, which previously could have employed additional steps or masks.

Also, according to the present invention, the OLED panel and the driving panel are formed using separate processes, thus making it possible to check the characteristics of the OLED panel and the driving panel before attaching them together to complete the OELD. Therefore, unlike the prior art, it is possible to minimize the rate of defective OELDs which may be caused by cumulative fabrication processes for a driving circuit, an OLED, and an encapsulation thereof.

Also, according to the present invention, the OLED, which is fabricated at high temperatures, and the OTFT, which is fabricated at low temperatures, are formed on different substrates, thereby making it possible to prevent the OTFT from being degraded by the high-temperature heat generated during the formation of the OLED. In addition, since organic materials are greatly affected by UV radiation, conventional OELDs have limitations in the processes and materials which may be used for forming an anode, a cathode, and an encapsulation structure thereof. However, the OELD according to the present invention has no such limitations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent display comprising:
a plurality of organic light-emitting diodes;
a driving circuit driving the organic light-emitting diodes;
an organic light-emitting diode panel having a first substrate on which the organic light-emitting diodes are arranged;
a driving panel having a second substrate on which the driving circuit is formed;
first dam-type banks formed on the first substrate and separating each of the plurality of organic light-emitting diodes; and
electrical connection units disposed corresponding to each other between the first and second substrates, to electrically connect the organic light-emitting diodes to the driving circuit, at least one of the electrical connection units being disposed on the first dam-type banks,
wherein the organic light-emitting diode panel and the driving panel are combined, and the dam-type banks are disposed between the electrical connection units and the substrate to which the electrical connection unit corresponds.

2. The organic electroluminescent display of claim 1, wherein the electrical connection units comprise first and second conductive pads disposed opposite one another on the organic light-emitting diode panel and the driving panel, respectively.

3. The organic electroluminescent display of claim 2, wherein the first conductive pad is formed on the top surface of the first dam-type bank.

4. The organic electroluminescent display of claim 3, further comprising second dam-type banks formed on the second substrate corresponding in location to the first dam-type banks, the second conductive pad being formed on the top surface of the second dam-type bank.

5. The organic electroluminescent display of claim 4, wherein the driving circuit comprises an organic thin film transistor.

6. The organic electroluminescent display of claim 4, wherein the driving circuit comprises an inorganic thin film transistor.

7. The organic electroluminescent display of claim 3, wherein the driving circuit comprises an organic thin film transistor.

8. The organic electroluminescent display of claim 7, wherein at least one of the first and second dam-type banks has a trapezoidal cross-section wherein the width decreases toward the top surface thereof.

9. The organic electroluminescent display of claim 7, wherein at least one of the first and second dam-type banks has an inverted trapezoidal cross-section wherein the width increases toward the top surface thereof.

10. The organic electroluminescent display of claim 3, wherein the driving circuit comprises an inorganic thin film transistor.

11. The organic electroluminescent display of claim 2, wherein the driving circuit comprises an organic thin film transistor.

12. The organic electroluminescent display of claim 11, wherein at least one of the first and second dam-type banks has a trapezoidal cross-section wherein the width decreases toward the top surface thereof.

13. The organic electroluminescent display of claim 11, wherein at least one of the first and second dam-type banks has an inverted trapezoidal cross-section wherein the width increases toward the top surface thereof.

14. The organic electroluminescent display of claim 2, wherein the driving circuit comprises an inorganic thin film transistor.

15. The organic electroluminescent display of claim 1, wherein the driving circuit comprises an organic thin film transistor.

16. The organic electroluminescent display of claim 15, wherein at least one of the first and second dam-type banks has a trapezoidal cross-section wherein the width decreases toward the top surface thereof.

17. The organic electroluminescent display of claim 15, wherein at least one of the first and second dam-type banks has an inverted trapezoidal cross-section wherein the width increases toward the top surface thereof.

18. The organic electroluminescent display of claim 1, wherein the driving circuit comprises an inorganic thin film transistor.

19. The organic electroluminescent display of claim 18, wherein at least one of the first and second dam-type banks has a trapezoidal cross-section wherein the width decreases toward the top surface thereof.

20. The organic electroluminescent display of claim 18, wherein at least one of the first and second dam-type banks has an inverted trapezoidal cross-section wherein the width increases toward the top surface thereof.

21. A method of manufacturing an organic electroluminescent display, the method comprising:
    forming a plurality of organic light-emitting diodes;
    forming a driving circuit for driving the organic light-emitting diodes;
    forming an organic light-emitting diode panel having a first substrate on which the organic light-emitting diodes are arranged;
    forming a driving panel having a second substrate on which the driving circuit is formed;
    forming first dam-type banks on the first substrate, wherein the first dam-type banks separate each of the plurality of organic light-emitting diodes;
    forming electrical connection units disposed corresponding to each other between the first and second substrates, to electrically connect the organic light-emitting diodes to the driving circuit at least one of the electrical connection units being disposed on the first dam-type banks; and
    combining the organic light-emitting diode panel and the driving panels,
    wherein the dam-type banks are disposed between the electrical connection units and the substrate to which the electrical connection unit corresponds.

22. An organic electroluminescent display comprising:
    a plurality of organic light-emitting diodes;
    a plurality of driving circuits, each of which drives the organic light-emitting diodes respectively;
    an organic light-emitting diode panel having a first substrate on which the organic light-emitting diodes are arranged;
    a driving panel having a second substrate on which the driving circuit corresponding to each of the organic light-emitting diodes, is formed;
    first dam-type banks formed on the first substrate and separating each of the plurality of organic light-emitting diodes;
    second dam-type banks formed on the second substrate corresponding in location to the first dam-type banks and separating each of the plurality of driving circuit,
    electrical connection units disposed corresponding to each other between the first and second substrates, to electrically connect each of the organic light-emitting diodes to each of the corresponding driving circuit,
    wherein the organic light-emitting diode panel and the driving panel are combined, and the dam-type banks are disposed between the electrical connection units and the substrate to which the electrical connection unit corresponds.

23. The organic electroluminescent display of claim 22, wherein the electrical connection units comprise first and second conductive pads disposed opposite one another on the first and second dam-type banks, respectively.

24. The organic electroluminescent display of claim 23, wherein the first conductive pad formed on the top surface of the first dam-type bank.

25. The organic electroluminescent display of claim 22, wherein at least one of the first and second dam-type banks has a trapezoidal cross-section wherein the width decreases toward the top surface thereof.

26. The organic electroluminescent display of claim 22, wherein at least one of the first and second dam-type banks has an inverted trapezoidal cross-section wherein the width increases toward the top surface thereof.

* * * * *